(12) United States Patent
Jin et al.

(10) Patent No.: US 11,128,233 B2
(45) Date of Patent: Sep. 21, 2021

(54) PLANAR CONVERTER

(71) Applicant: DELTA ELECTRONICS, INC., Taoyuan (TW)

(72) Inventors: Da Jin, Taoyuan (TW); Yahong Xiong, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 136 days.

(21) Appl. No.: 16/601,576

(22) Filed: Oct. 14, 2019

(65) Prior Publication Data
US 2020/0127578 A1 Apr. 23, 2020

(30) Foreign Application Priority Data
Oct. 19, 2018 (CN) .......................... 201811222289.6

(51) Int. Cl.
*H05K 1/16* (2006.01)
*H01F 17/00* (2006.01)
(Continued)

(52) U.S. Cl.
CPC ............ *H02M 7/003* (2013.01); *H01F 27/24* (2013.01); *H01F 27/2804* (2013.01);
(Continued)

(58) Field of Classification Search
CPC ........... H05K 1/16; H05K 1/165; H02M 7/00; H02M 7/003; H02M 3/00; H02M 3/28; H02M 3/158; H02M 3/335; H01F 27/02; H01F 27/24; H01F 27/26; H01F 27/28; H01F 27/29; H01F 27/32; H01F 27/40
(Continued)

(56) References Cited

U.S. PATENT DOCUMENTS 6,420,953 B1 * 7/2002 Dadafshar ............. H01F 27/027
336/200
6,914,508 B2 * 7/2005 Ferencz ................ H01F 27/266
29/602.1

(Continued)

FOREIGN PATENT DOCUMENTS

CN 101017730 A 8/2007
CN 205282267 U 6/2016
(Continued)

*Primary Examiner* — Xiaoliang Chen
(74) *Attorney, Agent, or Firm* — CKC & Partners Co., LLC

(57) ABSTRACT

The present invention relates to a planar converter, comprising: a magnetic unit comprising a first planar winding and two second planar windings magnetically coupled to each other and a magnetic core assembly; two closed circuits each comprises the first planar winding, a switch, and has a first connection point and a second connection point; two PCBs each provided with at least one of the closed circuits thereon; and two first connectors each comprising two welding ends opposite to each other, wherein the two welding ends of one of the two first connectors are connected to the first connection points of the two closed circuits, respectively, and the two welding ends of another one of the two first connectors are connected to the second connection points of the two closed circuits, respectively, and the two closed circuits are connected in parallel.

15 Claims, 11 Drawing Sheets

(51) Int. Cl.

| | | |
|---|---|---|
| *H01F 17/04* | (2006.01) | |
| *H01F 27/02* | (2006.01) | |
| *H01F 27/24* | (2006.01) | |
| *H01F 27/26* | (2006.01) | |
| *H01F 27/28* | (2006.01) | |
| *H01F 27/29* | (2006.01) | |
| *H01F 27/32* | (2006.01) | |
| *H01F 27/40* | (2006.01) | |
| *H02M 3/00* | (2006.01) | |
| *H02M 3/28* | (2006.01) | |
| *H02M 3/158* | (2006.01) | |
| *H02M 3/335* | (2006.01) | |
| *H02M 7/00* | (2006.01) | |
| *H01R 12/52* | (2011.01) | |
| *H05K 1/14* | (2006.01) | |
| *H05K 1/18* | (2006.01) | |

(52) U.S. Cl.
CPC ...... *H01R 12/523* (2013.01); *H02M 3/33523* (2013.01); *H05K 1/144* (2013.01); *H05K 1/165* (2013.01); *H05K 1/18* (2013.01); *H01F 2027/2809* (2013.01); *H01F 2027/2819* (2013.01); *H05K 2201/066* (2013.01); *H05K 2201/10166* (2013.01)

(58) Field of Classification Search
USPC ........ 361/781, 793; 336/180, 200, 212, 221, 336/223, 232; 174/260; 1/1
See application file for complete search history.

(56) References Cited

U.S. PATENT DOCUMENTS

| | | | |
|---|---|---|---|
| 9,729,059 B1* | 8/2017 | Parto | H02M 7/003 |
| 11,031,177 B2* | 6/2021 | Nakajima | H01F 30/10 |
| 2002/0075116 A1* | 6/2002 | Peels | H01F 27/2804 |
| | | | 336/200 |
| 2007/0152795 A1* | 7/2007 | Zeng | H01F 27/2804 |
| | | | 336/212 |
| 2008/0231403 A1* | 9/2008 | Hsu | H01F 27/2847 |
| | | | 336/180 |
| 2009/0085702 A1 | 4/2009 | Zeng et al. | |
| 2010/0214053 A1* | 8/2010 | Chen | H01F 38/10 |
| | | | 336/221 |
| 2014/0375411 A1* | 12/2014 | Scholz | H01F 27/323 |
| | | | 336/200 |
| 2016/0307695 A1* | 10/2016 | Jitaru | H01F 19/04 |
| 2017/0324346 A1* | 11/2017 | Shin | H01F 27/2804 |

FOREIGN PATENT DOCUMENTS

| CN | 106712518 A | 5/2017 |
|---|---|---|
| CN | 107424794 A | 12/2017 |

* cited by examiner

PLANAR CONVERTER

CROSS-REFERENCE TO RELATED APPLICATIONS

This non-provisional application claims priority under 35 U.S.C. § 119(a) on Patent Application No. 201811222289.6 filed in P.R. China on Oct. 19, 2018, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present invention relates to a converter, and particularly to a planar converter.

BACKGROUND ART

Nowadays, with rapid development of science and technology, power supply products are developing towards high efficiency and high power density. Generally, a converter is needed in the power supply product to convert the received electrical energy and to supply electrical energy required by relevant device inside the power supply product. For satisfying the requirement for high efficiency, high power density and small size, the printed circuit board (PCB) of the converter is designed to have multiple layers and high density routings. In the prior art application, the electrical components and the windings of inductance assembly are positioned in a top layer or a bottom layer of a multilayered PCB, and the routings are positioned in a middle layer of the multilayered PCB. In addition, the routings in respective layers of the multilayered PCB are connected via a through hole, a blind hole or a buried hole, to effectively reduce the size of the multilayered PCB.

However, in the application of a high power supply, an output current of the converter becomes larger, and a resistance value of a parasitic resistance on a path through which a large current flows becomes crucial. A parasitic resistance with a larger resistance value may result in much more energy loss, such that the efficiency of the converter is reduced. In the conventional converter, the number of the middle layers of the multilayered PCB is increased, such that the large current may flow through the multilayered routings of the middle layers, and the multilayered routings are connected in parallel via the through hole to reduce the wire resistance, such that the energy loss of the inductance assembly can be reduced. However, when the number of layers of the multilayered PCB is increased, the parasitic parameter and the parasitic resistance of the through hole are large, such that the converter produces additional energy loss. Even further, the cost of the multilayered PCB will be increased as the number of layers is increased. For example, the cost of the multilayered PCB having 20 layers is at least twice or more than the cost of the multilayered PCB having 10 layers. When the number of layers is larger than a certain value, the performance cannot be improved markedly; however, the cost of the multilayered PCB rises exponentially. As can be known above, simply increasing the number of layers of the multilayered PCB cannot optimally solve the problem of a larger output current of the converter.

Considering of the above issue, it is important to develop a planer converter capable of overcoming the deficiencies in the prior art.

DISCLOSURE OF THE PRESENT INVENTION

An object of the present invention is to provide a planar converter to overcome the deficiencies of the converter using a single multilayered PCB according to the prior art, which has low efficiency, high cost and difficulty in efficiency improvement because the prior art converter can only increase the number of layers of the single multilayered PCB to prevent the output current from increasing.

Another object of the present invention is to provide a planar converter, which can improve the efficiency of heat dissipation.

To achieve the objects, one aspect of the present invention is to provide a planar converter, comprising: a magnetic unit comprising at least two first planar windings, at least one second planar winding and a magnetic core assembly, the at least two first planar windings and the at least one second planar winding magnetically coupled through the magnetic core assembly; at least two closed circuits, wherein each closed circuit comprises at least one of the first planar windings, at least one first switch, and has at least two connection points comprising a first connection point and a second connection point; two printed circuit boards (PCBs), wherein each printed circuit board comprises a first surface and a second surface opposite to each other, and each printed circuit board is provided with at least one of the closed circuits thereon, wherein the second surfaces of the two printed circuit boards are adjacent; and at least two first connectors, each comprising two welding ends opposite to each other; wherein the two welding ends of one of the at least two first connectors are connected to the first connection points of the two closed circuits on the two PCBs, respectively, and the two welding ends of another one of the at least two first connectors are connected to the second connection points of the two closed circuits on the two PCBs, respectively, and the two closed circuits are electrically connected in parallel through the two first connectors.

To achieve the objects, another aspect of the present invention is to provide a planar converter, comprising: a magnetic unit comprising at least two first planar windings, at least two second planar windings and a magnetic core assembly, the at least two first planar windings and the at least two second planar windings magnetically coupled through the magnetic core assembly; at least two closed circuits, wherein each closed circuit comprises at least one of the first planar windings, at least one first switch, and at least two connection points comprising a first connection point and a second connection point; and two printed circuit boards (PCBs), wherein each printed circuit board comprises a first surface and a second surface opposite to each other, and each printed circuit board is provided with at least one of the closed circuits thereon, wherein the second surfaces of the two printed boards are adjacent and the second surfaces of the two printed circuit board are directly welded to each other, and the first connection points of the two closed circuits are electrically connected and the second connection points of the two closed circuits are electrically connected and the two closed circuits are connected in parallel.

DETAILED DESCRIPTION OF THE EXEMPLARY EMBODIMENTS

The exemplary embodiments for implementing the features and advantages of the present invention will be described in detail. It shall be understood that the present invention may be embodied in various different forms without departing from the scope of the present invention, and the detailed descriptions and drawings are provided for explanations, rather than limiting the present invention.

Figure 1:
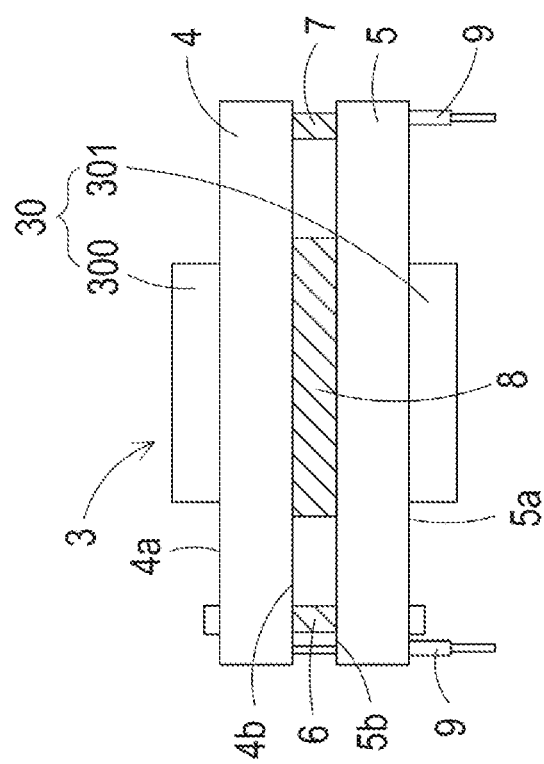
FIG. 1 is a structural diagram of a planar converter according to a first embodiment of the present invention.
Figure 2:
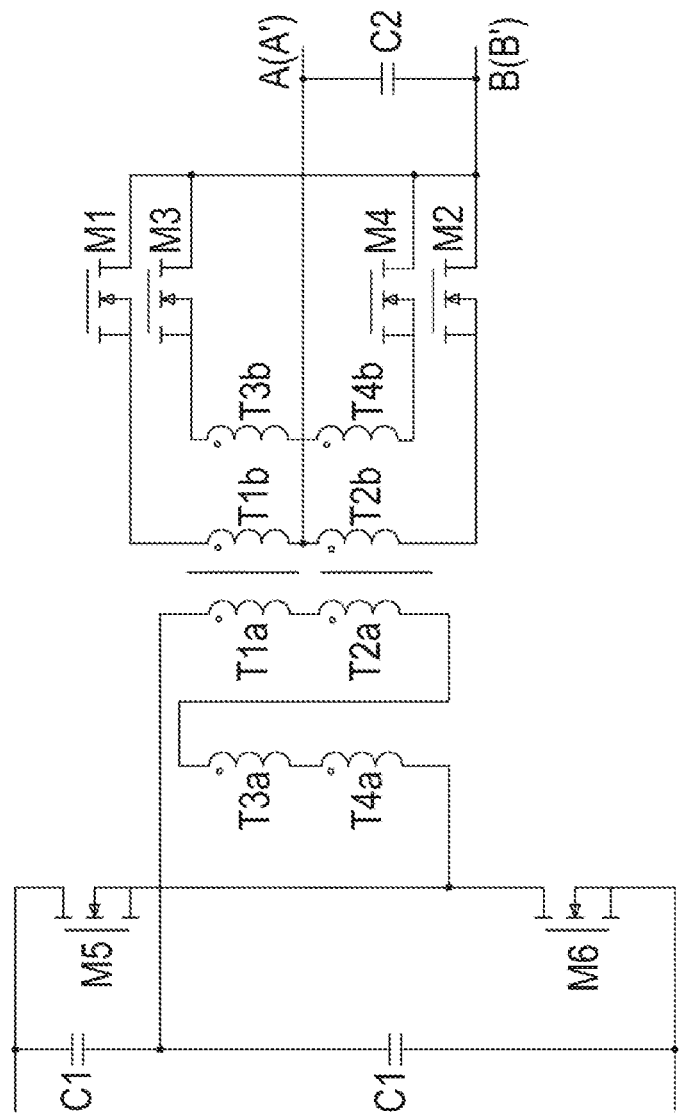
FIG. 2 is a schematic diagram of a dual flyback circuit.

FIG. 1 is a structural diagram of a planar converter according to a first embodiment of the present invention, and FIG. 2 is a schematic diagram of a dual flyback circuit. As shown in the FIGS. 1 and 2, the circuit topology of a planar converter 1 in this embodiment can be the dual flyback circuit 2, but the present invention is not limited thereto. The dual flyback circuit 2 comprises at least two first planar windings, such as four first planar windings T1$b$, T2$b$, T3$b$ and T4$b$ as shown in FIG. 2, at least two first switches, such as four first switches M1, M2, M3 and M4 as shown in FIG. 2, and at least two second planar windings, such as four second planar windings T1$a$, T2$a$, T3$a$ and T4$a$ as shown in FIG. 2. The first planar windings and the second planar windings are magnetically coupled together to form a magnetic unit. In one embodiment, the magnetic unit can be a transformer comprising a first side and a second side. The first planar windings and the second planar windings are the second side windings and the first side windings respectively. In one embodiment, the first side and the second side of the transformer are the primary side and the secondary side respectively. In other embodiment, the first side and the second side of the transformer are the secondary side and the primary side respectively A first closed circuit is formed by the first planar windings T1$b$ and T2$b$ and the first switches M1 and M2, which can be but not limited to a center tapped full-wave rectifier circuit. The first closed circuit is performed as a second side switching circuit of the dual flyback circuit 2, and the first closed circuit further comprises a first connection point A and a second connection point B serving as power terminals to transmit energy. The first connection point A and the second connection point B are both DC potential points. A second closed circuit is formed by the first planar windings T3$b$ and T4$b$ and the first switches M3 and M4, which can be but not limited to a center tapped full-wave rectifier circuit. The second closed circuit is performed as a second side switching circuit of the dual flyback circuit 2, and the second closed circuit further comprises a first connection point A' and a second connection point B' serving as power terminals to transmit energy. The first connection point A' and the second connection point B' are both DC potential points. The four second planar windings T1$a$, T2$a$, T3$a$ and T4$a$ are connected in series, and magnetically coupled to the four first planar windings T1$b$, T2$b$, T3$b$ and T4$b$.

Please refer to the FIG. 2 again, since the first connection point A and the first connection point A' are electrically connected and have the same potential, and the second connection point B and the second connection point B' are electrically connected and have the same potential, the first connection point A is equivalent to the first connection point A', and the second connection point B is equivalent to the second connection point B' in FIG. 2. Even further, the first connection point A (the first connection point A') and the second connection point B (the second connection point B') can serve as power terminals to transmit energy, such as output terminals of the dual flyback circuit 2. Still further, one end of the first planar winding T1$b$ is electrically connected to one end of the first switch M1, one end of the first planar winding T2$b$ is electrically connected to one end of the first switch M2, one end of the first planar winding T3$b$ is electrically connected to one end of the first switch M3, and one end of the first planar winding T4$b$ is electrically connected to one end of the first switch M4. In addition, the number of turns of the first planar windings T1$b$ and T2$b$ in the first closed circuit and the number of turns of the first planar windings T3$b$ and T4$b$ in the second closed circuit are less than the number of turns of the second planar windings T1$a$, T2$a$, T3$a$ and T4$a$, respectively.

In other embodiments, the dual flyback circuit 2 may further comprise two or more second switches, such as two second switches M5 and M6 as shown in FIG. 2. The second switches M5, M6 are connected to the four second planar windings T1$a$, T2$a$, T3$a$ and T4$a$ to form a first side switching circuit, such as a half-bridge circuit, such that the four second planar windings T1$a$, T2$a$, T3$a$ and T4$a$ generate AC electrical energy and the four first planar windings T1$b$, T2$b$, T3$b$ and T4$b$ correspondingly generate the coupled AC electrical energy.

Figure 3:
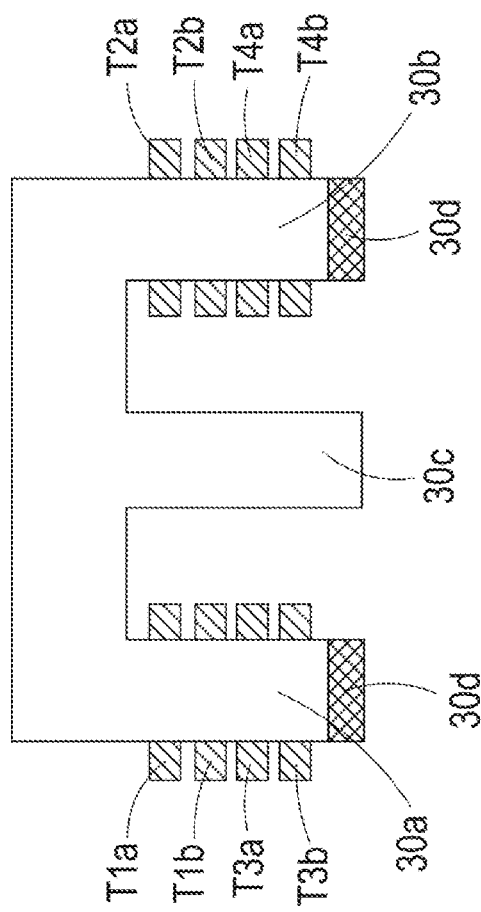
FIG. 3 is a schematic diagram of a first planar winding and a second planar winding of a magnetic unit in FIG. 1.
Figure 4:
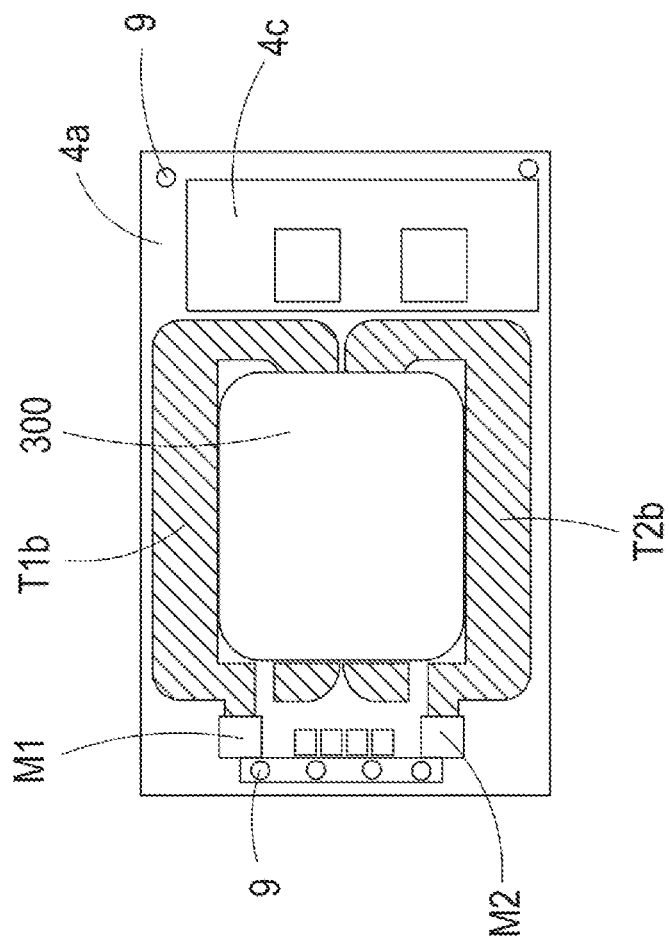
FIG. 4 is a plan diagram of a first surface of a first multilayered PCB in FIG. 1.
Figure 5:
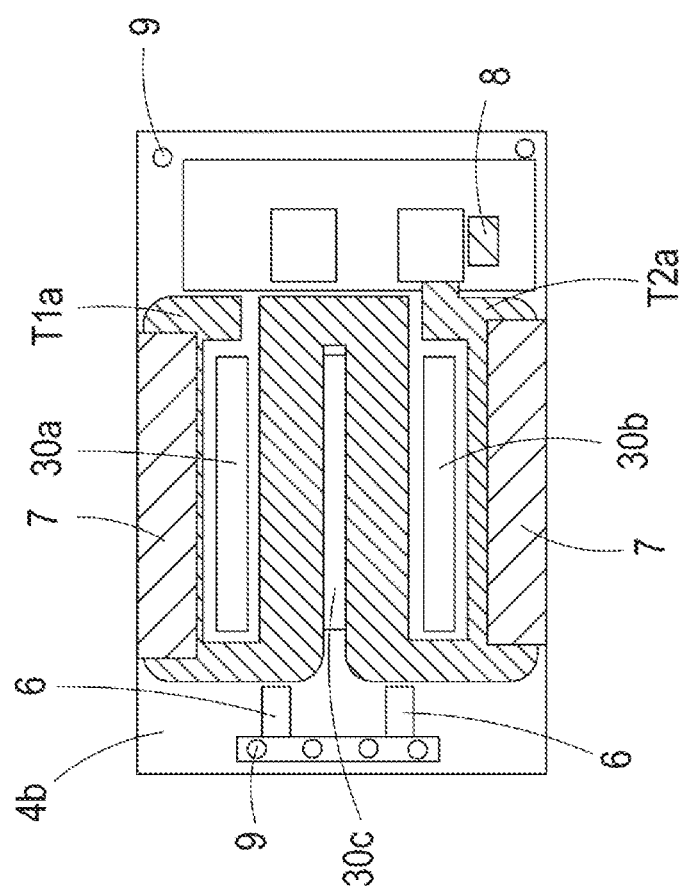
FIG. 5 is a plan diagram of a second surface of the first multilayered PCB in FIG. 1.
Figure 6:
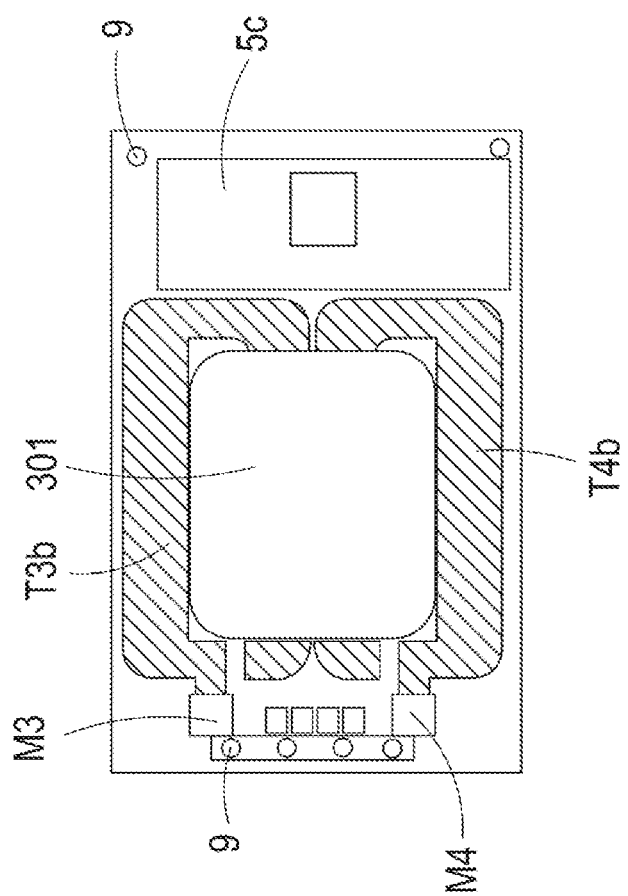
FIG. 6 is a plan diagram of a first surface of a second multilayered PCB in FIG. 1.

FIG. 3 is a schematic diagram of a first planar winding and a second planar winding of a magnetic unit in FIG. 1, FIG. 4 is a plan diagram of a first surface of a first multilayered PCB in FIG. 1, FIG. 5 is a plan diagram of a second surface of the first multilayered PCB in FIG. 1, and FIG. 6 is a plan diagram of a first surface of a second multilayered PCB in FIG. 1. As shown in FIGS. 1-6, the planar converter 1 in this embodiment comprises a magnetic unit 3, at least two closed circuits, two PCBs 4 and 5 and at least two first connectors 6.

In this embodiment, the magnetic unit 3 can be a transformer, but the present invention is not limited thereto. The magnetic unit 3 comprises four first planar windings T1$b$, T2$b$, T3$b$ and T4$b$, four second planar windings T1$a$, T2$a$, T3$a$ and T4$a$ and a magnetic core assembly 30. The first planar windings T1$b$, T2$b$, T3$b$ and T4$b$ and the second planar windings T1$a$, T2$a$, T3$a$ and T4$a$ can be magnetically coupled through the magnetic core assembly 30. The magnetic core assembly 30 includes two magnetic cores 300 and 301, for example, two E-type magnetic cores, or an E-type magnetic core and an I-type magnetic core respectively, but the present invention is not limited thereto. As shown in FIG. 3, taking an E-type magnetic core for example, the magnetic core assembly 30 may comprise two side columns 30$a$ and 30$b$ and a central column 30$c$. In some embodiments, the second planar windings T1$a$ and T3$a$ and the first planar windings T1$b$ and T3$b$ may be winded around one side column 30$a$ of the magnetic core assembly 30, and the second planar windings T2$a$ and T4$a$ and the first planar windings T2$b$ and T4$b$ may be winded around another side column 30$b$ of the magnetic core assembly 30. In addition, the magnetic core assembly 30 has air gaps 30$d$ (as shown in FIG. 3) on the two side columns 30$a$, 30$b$. It shall be noted that the drawings only illustrate the coupling relationships between the respective windings, without limiting the sequence of winding or placing of the respective windings in the magnetic core assembly 30. The sequences of winding and placing can be changed according to actual situations.

The two PCBs 4 and 5 may be multilayered PCBs, respectively, but the present invention is not limited thereto. The two PCBs 4 and 5 are disposed adjacent and parallel to each other. In addition, the PCB 4 comprises a first surface 4$a$ and a second surface 4$b$, the PCB 5 comprises a first surface 5$a$ and a second surface 5$b$, and the second surface 4$b$ of the PCB 4 is adjacent to the second surface 5$b$ of the he PCB 5.

In this embodiment, as shown in FIG. 4, the first surface 4$a$ of the PCB 4 can be provided for installing the first closed circuit, that is, the first planar winding T1$b$ and T2$b$ and the first switches M1 and M2 are disposed on the first surface 4$a$. In addition, the first surface 4$a$ can be provided for installing the magnetic core 300. In some embodiments, the first switch M1 is disposed to be adjacent to one end of the first planar winding T1$b$, and the first switch M2 is disposed to be adjacent to one end of the first planar winding T2$b$, in order to obtain a minimum closed circuit for AC signal on the second side of the magnetic unit 3. Even further, the first surface 4$a$ may further comprise an installation region 4$c$ for disposing electrical components belonging to first side switching circuit of the planar converter 1 and/or a control circuit (not shown).

In this embodiment, since the second surface 4$b$ of the PCB 4 and the second surface 5$b$ of the PCB 5 have similar functions and similar components disposed thereon, the second surface 4$b$ of the PCB 4 is shown in FIG. 5, and the second surface 5$b$ of the PCB 5 will not be repeatedly illustrated. The second surface 4$b$ of the PCB 4 is provided for installing the second planar windings T1$a$ and T2$a$, and the two side columns 30$a$, 30$b$ and the central column 30$c$ of the magnetic core assembly 30 may penetrate the first surface 4$a$ and the second surface 4$b$ of the PCB 4. The second surface 5$b$ of the PCB 5 is provided for installing the second planar windings T3$a$ and T4$a$, and the two side columns 30$a$, 30$b$ and the central column 30$c$ of the magnetic core assembly 30 may penetrate the first surface 5$a$ and the second surface 5$b$ of the PCB 5 through the PCB 5. In other embodiments, the second surface 4$b$ of the PCB 4 may be provided for installing the second planar windings T3$a$ and T4$a$, and the second surface 5$b$ of the PCB 5 may be provided for installing the second planar windings T1$a$ and T2$a$. In addition, the second switches M5 and M6 may be disposed on the second surface 4$b$ of the PCB 4 or the second surface 5$b$ of the PCB 5.

As shown in FIG. 6, the first surface 5$a$ of the PCB 5 may be provided for installing the second closed circuit, that is, the first planar windings T3$b$ and T4$b$ and the first switches M3 and M4 are disposed on the first surface 5$a$. Moreover, the first surface 5$a$ may be further provided for installing the magnetic core 301, and the magnetic cores 300 and 301 can constitute the magnetic core assembly 30 between the PCBs 4 and 5. In some embodiments, the first switch M3 is disposed to be adjacent to one end of the first planar winding T3$b$, and the first switch M4 is disposed to be adjacent to one end of the first planar winding T4$b$, in order to obtain the closed circuit for AC signal on the second side of the magnetic unit 3. Moreover, the second surface 5$b$ may further comprise an installation region 5$c$ for disposing electrical components belonging to first side switching circuit of the planar converter 1 and/or a control circuit (not shown).

In other embodiment, the second surface 4$b$ of the PCB 4 and the second surface 5$b$ of the PCB 5 can be provided for installing the first closed circuit and the second closed circuit, respectively. The first surface 4$a$ of the PCB 4 or the first surface 5$a$ of the PCB 5 can be provided for installing the second planar windings T1$a$, T2$a$, T3$b$ and T4$b$, or the first surface 4$a$ of the PCB 4 and the first surface 5$a$ of the PCB 5 can be provided for installing the second planar windings T1$a$,T2$a$ and T3$b$,T4$b$, respectively.

In some embodiments, some terminals on the second surface 4$b$ of the PCB 4 may be electrically connected to the first connection point A and the second connection point B on the first surface 4$a$ through the routings inside the PCB 4, and some terminals on the second surface 5$b$ of the PCB 5 may be electrically connected to the first connection point A' and the second connection point B' on the first surface 5$a$ through the routings inside the PCB 5. In other embodiments, some terminals on the second surface 4$b$ of the PCB 4 may be electrically connected to other terminals than the first connection point A and the second connection point B on the first surface 4$a$ through the routings inside the PCB 4, and some terminals on the second surface 5$b$ of the PCB 5 may be electrically connected to other terminals than the first connection point A' and the second connection point B' on the first surface 5$a$ through the routings inside the PCB 5. Therefore, the respective components on the first surface 4$a$ and the second surface 4$b$ of the PCB 4 may be electrically connected to each other using the routings inside the PCB 4, and the respective components on the first surface 5$a$ and the second surface 5$b$ of the PCB 5 may be electrically connected to each other using the routings inside the PCB 5.

In this embodiment, the two first connectors 6 may be made from electrical conductive material having good heat conductive property, such as copper block, and disposed vertically between the PCBs 4 and 5, respectively. Each of the two first connectors 6 comprises two welding ends opposite to each other. The two welding ends of one of the first connectors 6 are directly connected to the second surface 4$b$ of the PCB 4 and the second surface 5$b$ of the PCB 5 by weld, respectively, so that the first connection point A of the first closed circuit on the PCB 4 and the first connection point A' of the second closed circuit on the PCB 5 are electrically connected. Similarly, the two welding ends of another one of the two first connectors 6 are directly connected to the second surface 4$b$ of the PCB 4 and the second surface 5b of the PCB 5 by weld, respectively, so that the second connection point B of the first closed circuit on the PCB 4 and the second connection point B' of the second closed circuit on the PCB 5 are electrically connected. Since the two first connectors 6 are directly connected to the first connection points A and A' and the second connection points B and B' of the first closed circuit and the second closed circuit, a minimum electrical path may be formed between the first connection points A and A' and between the second connection points B and B', respectively, such that the first closed circuit and the second closed circuit may be configured as a minimum closed circuit for AC signal. Further, when the PCB 4 overlaps with the PCB 5, the two first connectors 6 can provide a good supporting between the PCBs 4 and 5. Even further, since the first connectors 6 have good heat conductive property, the heat dissipation efficiency of the planar converter 1 can be improved.

In other embodiments, the two first connectors 6 may be made from connection columns of electrical conductive material having good heat conductive property. Moreover, the second surface 4b of the PCB 4 and the second surface 5b of the PCB 5 may further comprise a plurality of first via holes (not shown), and the two welding ends of each of the first connectors 6 may be fixed to the corresponding first via holes on the second surfaces 4b and 5b through welding.

From the above on, in the planar converter 1 of the present invention, the first surface 4a and the second surface 4b of the PCB 4 and the first surface 5a and the second surface 5b of the PCB 5 can be sufficiently used to dispose the first planar windings T1b, T2b, T3b and T4b and the second planar windings T1a, T2a, T3a and T4a of the magnetic unit 3 by overlapping the two PCBs 4 and 5. The planar converter 1 of the present invention can be reduced in size by using the planar windings. Compared with the conventional converter, which uses a single multilayered PCB with more layers to dispose the relevant components of the converter, the number of layers of the planar converter 1 of the present invention is less than the number of layers of the single multilayered PCB. Furthermore, compared with the conventional converter, the cost of the planar converter 1 of the present invention is reduced and the efficiency is improved. Moreover, since the switches and other separate components of the planar converter 1 of the present invention are evenly disposed on two surfaces of the PCB 4 and two surfaces of the PCB 5, the heat generated by the switches is uniformly distributed in the planar converter 1. Meanwhile, because of the good heat conductive property of the first connectors 6 in the planar converter 1 of the present invention, the heat dissipation efficiency can be greatly improved.

In other embodiments, as shown in FIG. 5, the planar converter 1 may further comprise at least one second connector 7. Each of the at least one second connector 7 is made from electrical conductive material with good heat conductive property, such as copper block. Each of the second connectors 7 is located between the PCBs 4 and 5 and comprises two welding ends opposite to each other. One welding end of each of the second connectors 7 may be directly connected to the corresponding second planar windings on the second surface 4b of the PCB 4 by weld, such as the second planar windings T1a and T2a as shown in FIG. 5. The other welding end of each of second connectors 7 may be directly connected to the corresponding second planar windings on the second surface 5b of the PCB 5 by weld, such as the second planar windings T3a and T4a. Each of the second connectors 7 can dissipate heat generated by the second planar windings welded thereto. The second planar windings on the second surface 4b of the PCB 4 and the second planar windings on the second surface 5b of the PCB 5 may be electrically connected by the second connectors 7. In other embodiments, each of the second connectors 7 may be made from connection pillar of electrical conductive material with good heat conductive property. Moreover, the second surface 4b of the PCB 4 and the second surface 5b of the PCB 5 may further comprise a plurality of second via holes (not shown), and the two welding ends of each of the second connectors 7 may be fixed to the corresponding second via hole on the second surfaces 4b and 5b through welding, respectively.

In addition, the connection relationships of the second connectors 7 and PCB 4 or PCB 5 is not limited to the above disclosures. In other embodiment, one of the welding ends of each second connector is disposed on the first planar windings on the second surface of one of the two PCBs, another one of the welding ends of each second connector is disposed on the first planar windings on the second surface of another one of the two PCBs. In still other embodiments, one welding end of each of the second connectors 7 may be disposed on and connected to a projective region that the first planar windings or the second planar windings on PCB 4 are projected onto the second surface 4b. Similarly, the other welding end of each of the second connectors 7 may be disposed on and connected to a projective region that the first planar windings or the second planar windings on PCB 5 are projected onto the second surface 5b. In this embodiment, each of the second connectors 7 can dissipate heat generated by the first planar windings or the second planar windings on the PCB 4 and the first planar windings or the second planar windings on the PCB 5. In another embodiment, each of the second connectors 7 electrical connect the first planar windings on the PCB 4 and the second planar windings on the PCB 5.

In addition, as shown in FIG. 5, the planar converter 1 further comprises at least one heat dissipation assembly 8. Each of the at least one heat dissipation assembly is made from material with good heat conductive property, such as copper block. Each of the at least one heat dissipation assembly 8 is connected to the second surface 4b of the PCB 4 or the second surface 5b of the PCB 5 by weld and disposed to be adjacent to the heat generating assembly, such as the second switches M5 and M6 on the second surface 4b or the second surface 5b, wherein the at least one heat dissipation assembly 8 can effectively dissipate heat generated by the heat generating assembly.

In other embodiments, as shown in FIG. 1, the planar converter 1 further comprises two or more guide pins 9 made from electrical conductive material. The two guide pins 9 penetrate the PCBs 4 and 5 and protrude from the first surface 4a of the PCB 4 and/or the first surface 5a of the PCB 5. The two guide pins 9 may be inserted into a main board (not shown) so as to fix the planar converter 1 onto the main board. Further, one of the two guide pins 9 may constitute an input terminal of the planar converter 1, and another one of the guide pins 9 may constitute an output terminal of the planar converter 1.

The area for disposing the planar windings and the switches of the planar converter 1 of the present invention may be varied, without being limited to the above disclosure, and the present invention is not limited to thereto. For example, the first surface 4a of the PCB 4 may be provided with the corresponding first planer windings and the corresponding first switches, the first surface 5a of the PCB 5 may be provided with the corresponding first planer windings and the corresponding first switches, and only one of the second surfaces 4b and 5b is provided with the second planer windings and the second switches. Moreover, in one embodiment, the second surface 4b or 5b is provided with the first planer windings and the first switches, and the first surface 4a or 5a is provided with the second planer windings and the second switches.

In one embodiment, the PCBs 4 and 5 may be multilayered PCBs. The first planer winding or the second planer winding comprise N (N≥2) windings disposed on different layers of the PCB. The windings are connected in parallel by through holes, buried holes, or blind holes on the PCB to form the first planer winding or the second planer winding. The resistance value of the parasitic resistance of the planer winding can be reduced, thereby the energy loss of the planer winding is reduced. In one embodiment, one winding of the first planer winding or the second planer winding can be disposed on the first surface or the second surface of the PCB, and the remaining winding can be disposed in the middle layers of the PCB, respectively. The heat generated by the windings can be effectively delivered to outside through the second connectors 7 disposed on the windings. In another embodiment, each winding of the first planer winding or the second planer winding can be disposed in the middle layer of the PCB, and other electrical components than the first planer winding and the second planer winding can be disposed on the first surface and the second surface of the PCB.

The planar converter of the present invention is not limited to be applied to the dual flyback circuit 2 as shown in FIG. 2. The embodiment with two closed circuits which includes windings of inductance assembly and switches can use the two laminated PCBs, wherein the two closed circuits are disposed on the first or the second surfaces of the two PCBs, respectively, and electrically connect the two closed circuits in parallel through the two first connectors. Hereinafter, the circuits to which the planar converter of the present invention can be applied are exemplarily explained. Since the circuit structures of the exemplary circuits are similar with the circuit structure of the dual flyback circuit as shown in FIG. 2, the same reference signs are used to denote the same elements without repeating the details of the same elements.

Figure 7:
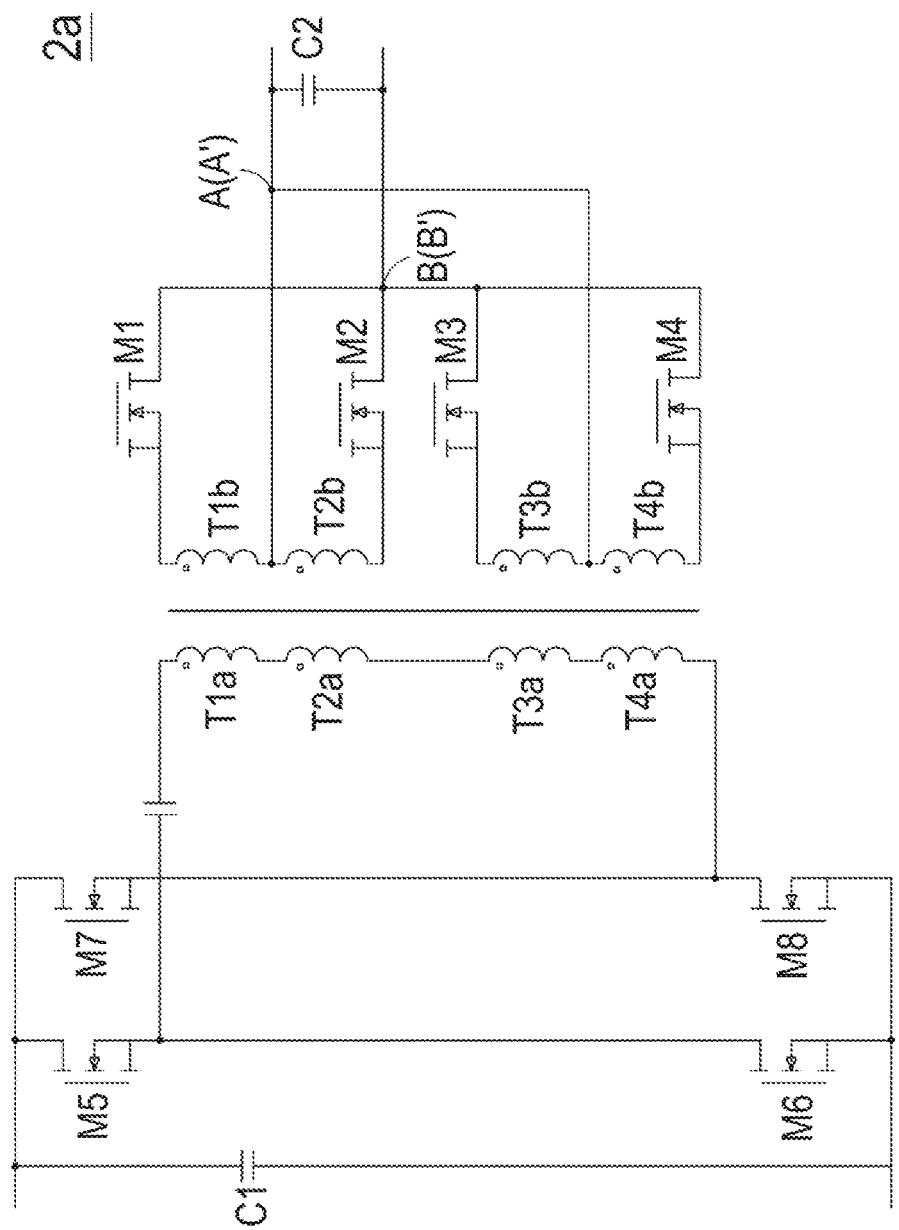
FIG. 7 is a schematic diagram of a DC/DC conversion circuit with integrated magnetic to which the planar converter of the present invention can be applied.

FIG. 7 is a schematic diagram of a DC/DC conversion circuit with integrated magnetic to which the planar converter of the present invention can be applied. As shown in FIG. 7, the planar converter of the present invention can be applied to a DC/DC conversion circuit 2a. A first side of the DC/DC conversion circuit 2a may comprise a full bridge circuit having four second switches M5, M6, M7 and M8, and at least two second planar windings, such as four second planar windings T1a, T2a, T3a and T4a. A second side of the DC/DC conversion circuit 2a may comprise at least two first planar windings, such as four first planar windings T1b, T2b, T3b and T4b, and at least two first switches, such as four first switches M1, M2, M3 and M4. The first planar windings T1b and T2b and the first switches M1 and M2 together form the first closed circuit, and the first closed circuit has a first connection point A and a second connection point B. The first planar windings T3b and T4b and the first switches M3 and M4 together form the second closed circuit, and the second closed circuit has a first connection point A' and a second connection point B'. Moreover, the first closed circuit and the second closed circuit are electrically connected in parallel.

Figure 8:
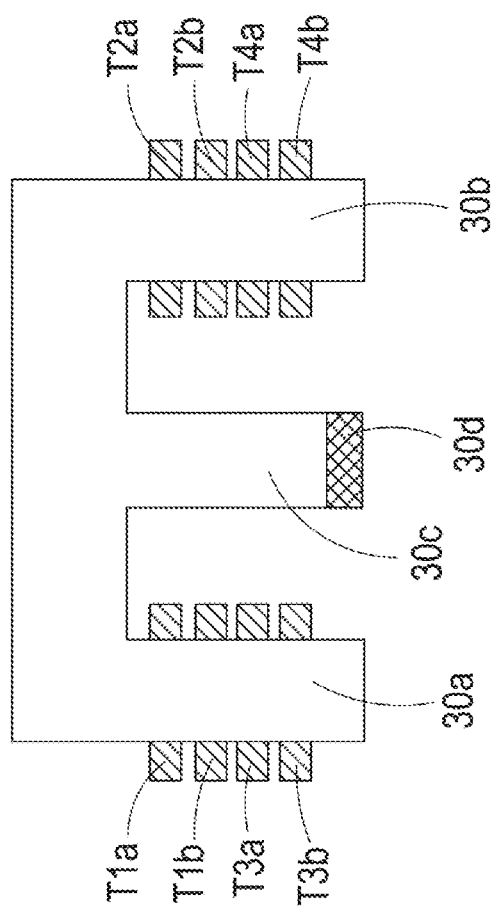
FIG. 8 is a schematic diagram of a first planar winding and a second planar winding of a magnetic unit of the planar converter of the present invention when applied to a DC/DC conversion circuit in FIG. 7.

FIG. 8 is a schematic diagram of a first planar winding and a second planar winding of a magnetic unit of the planar converter of the present invention when applied to the DC/DC conversion circuit in FIG. 7. As shown in FIG. 8, the first planar windings T1b and T2b and the second planar windings T1a, T2a, T3a and T4a and a magnetic core assembly are magnetically coupled together to form a magnetic unit. In this embodiment, the magnetic unit, such as a transformer, is provided with integrated magnetic, and the magnetic core assembly in this embodiment has an air gap 30d on a central column 30c, which is different from the magnetic core assembly having the air gaps 30d on the two side columns 30a and 30b as shown in FIG. 3.

From above on, in both of the embodiment in FIG. 7 and the embodiment in FIG. 2, the second planer windings of the planar converter are connected in series, and the first closed circuit and the second closed circuit are electrically connected in parallel, so the structure and the installation of the components of the planar converter applied to the DC/DC conversion circuit 2a with integrated magnetic in FIG. 7 are similar with those of the planar converter 1 in FIG. 1. However, the planar converter of the present invention is not limited thereto, and it is also possible in the planar converter disclosed by the present invention that the second planer windings on the first side are connected in parallel, and the two closed circuits on the second side are connected in parallel.

Figure 9:
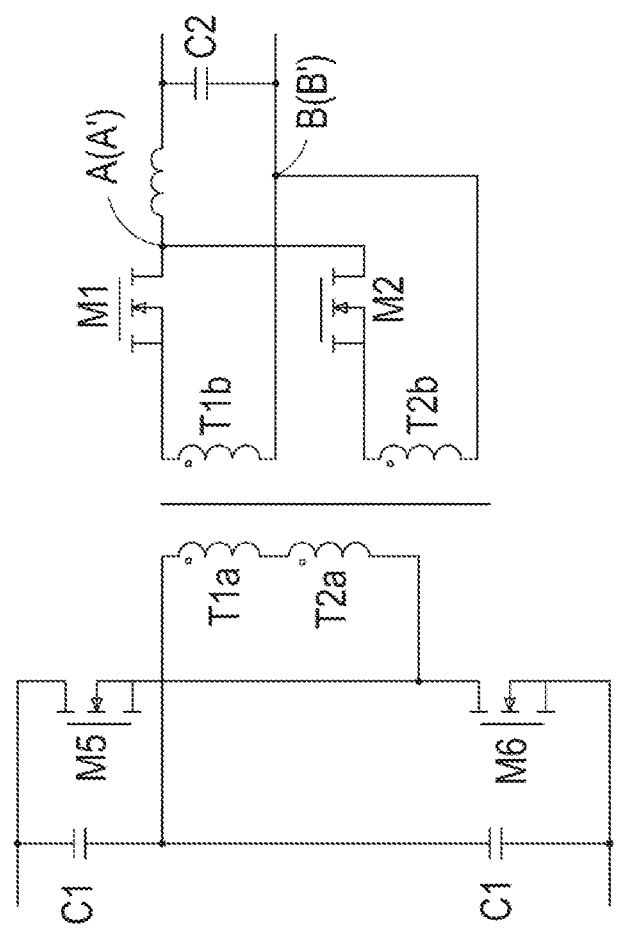
FIG. 9 is a schematic diagram of a DC/DC conversion circuit with half-bridge to which the planar converter of the present invention can be applied.

FIG. 9 is a schematic diagram of a DC/DC conversion circuit with half-bridge to which the planar converter of the present invention can be applied. As shown in FIG. 9, a first side of the DC/DC conversion circuit 2b with half-bridge may comprise a half-bridge circuit consisting of two second switches M5 and M6, and at least two second planar windings, such as two second planar windings T1a and T2a. A second side of the DC/DC conversion circuit 2b may comprise at least two first planar windings, such as two first planar windings T1b and T2b, and at least two first switches, such as two first switches M1 and M2. The first planar winding T1b and the first switch M1 together form the first closed circuit, and the first closed circuit has a first connection point A and a second connection point B. The first planar winding T2b and the first switch M2 together form the second closed circuit, and the second closed circuit has a first connection point A' and a second connection point B'. Moreover, the first closed circuit and the second closed circuit are electrically connected in parallel. In other embodiments, the DC/DC conversion circuit 2b may also be provided with integrated magnetic, which is the same as the integrated magnetic described previously.

Figure 10:
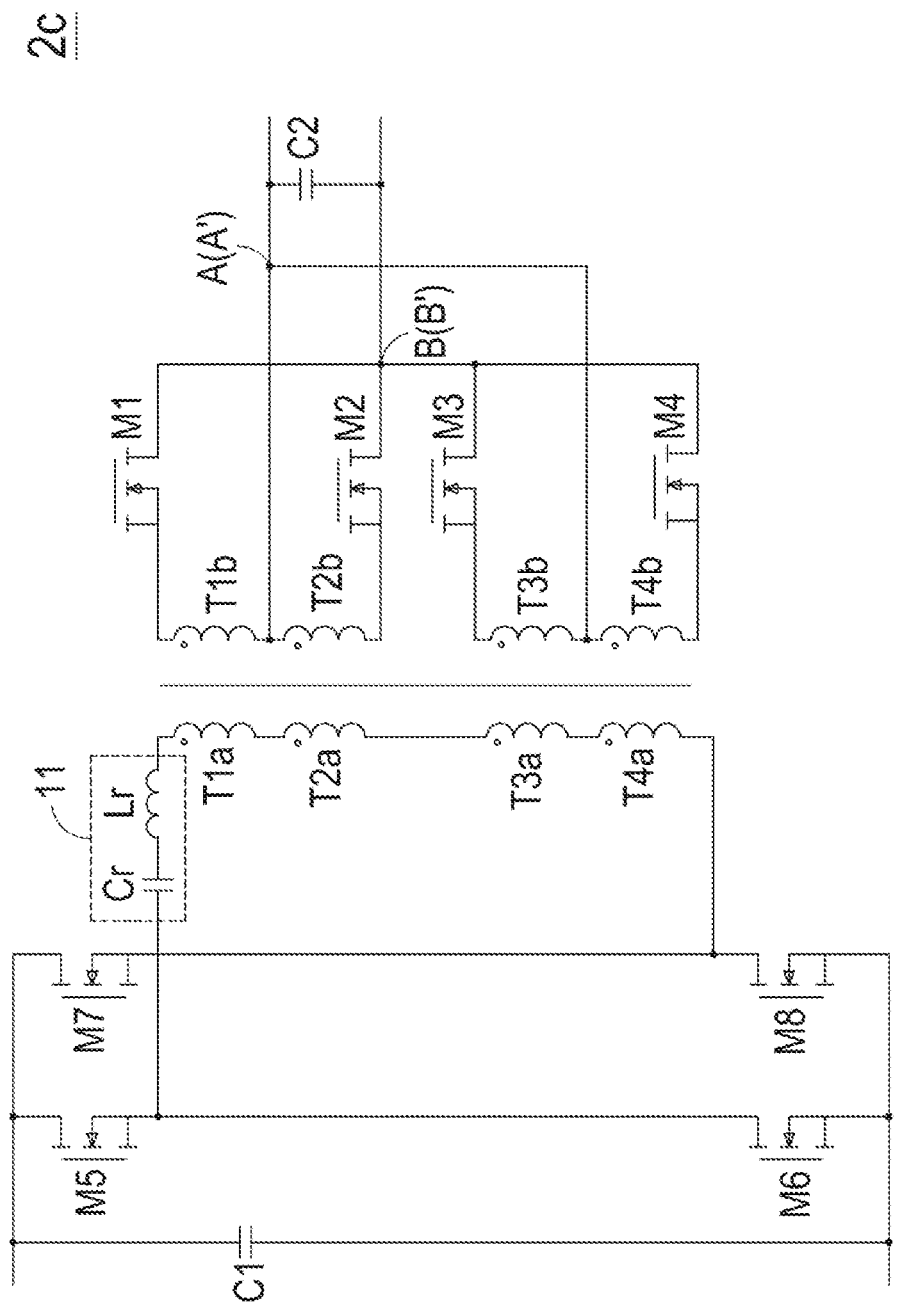
FIG. 10 is a schematic diagram of a LLC conversion circuit to which the planar converter of the present invention can be applied.

FIG. 10 is a schematic diagram of a LLC conversion circuit to which the planar converter of the present invention can be applied. As shown in FIG. 10, the planar converter of the present invention can be applied to the LLC conversion circuit 2c. A first side of the LLC conversion circuit 2c may comprise a full bridge circuit having four second switches M5, M6, M7 and M8, at least two second planar windings, such as four second planar windings T1a, T2a, T3a and T4a, and a resonance circuit 11 comprising a resonant inductor Lr and a resonant capacitor Cr. A second side of the LLC conversion circuit 2c may comprise at least two first planar windings, such as four first planar windings T1b, T2b, T3b and T4b, and at least two first switches, such as four first switches M1, M2, M3 and M4. The first planar windings T1b and T2b and the first switches M1 and M2 together form the first closed circuit, and the first closed circuit has a first connection point A and a second connection point B. The first planar windings T3b and T4b and the first switches M3 and M4 together form the second closed circuit, and the second closed circuit has a first connection point A' and a second connection point B'. Moreover, the first closed circuit and the second closed circuit are electrically connected in parallel.

Figure 11:
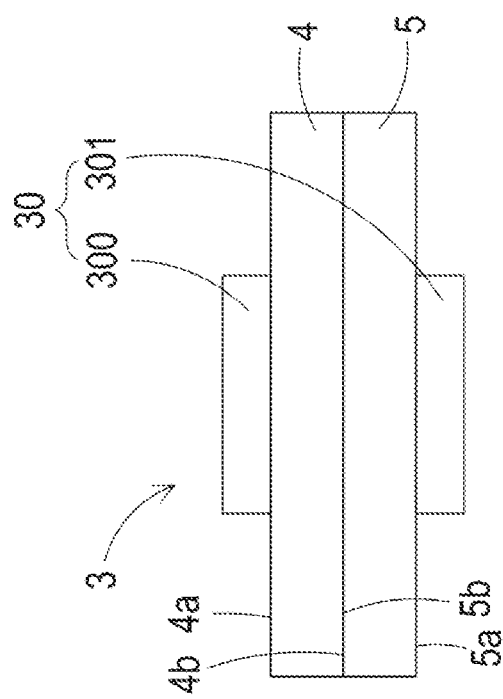
FIG. 11 is a structural diagram of a planar converter according to a second embodiment of the present invention.

FIG. 11 is a structural diagram of a planar converter according to a second embodiment of the present invention. As shown in FIG. 11, the structure of a planar converter 12 in this embodiment is similar with the structure of the planar converter 1 in FIG. 1, so the same reference signs are used to denote the elements having similar structure and function. As compared to the planar converter 1 in FIG. 1, the second surface 4b of the PCB 4 and the second surface 5b of the PCB 5 of the planar converter 12 in this embodiment are directly bonded and fixed through welding, or bonded and fixed through a connection assembly (not shown). Moreover, since the second surface 4b of the PCB 4 and the second surface 5b of the PCB 5 are bonded and fixed, the second surface 4b of the PCB 4 and the second surface 5b of the PCB 5 can be provided with only the second planar windings similar to those in FIG. 5. Instead, other electrical components are disposed on the first surface 4a of the PCB 4 and/or the first surface 5a of the PCB 5. Further, the first closed circuit and the second closed circuit are disposed on the first surface 4a of the PCB 4 and the first surface 5a of the PCB 5, respectively, and the first connection point and the second connection point of the first closed circuit and the first connection point and the second connection point of the second closed circuit are electrically connected, respectively, by welding the second surface 4b of the PCB 4 and the second surface 5b of the PCB 5. The magnetic unit of the planar converter 12 in this embodiment is disposed in similar manner as the magnetic unit 3 in FIG. 1, that is, the two magnetic cores of the magnetic core assembly of the magnetic unit are disposed on the first surface 4a of the PCB 4 and the first surface 5a of the PCB 5, respectively. The installations of other components inside the planar converter 12 in this embodiment are similar with the installations of other components inside the planar converter 1 in FIG. 1, and the effects of the planar converter 12 are similar with the effects of the planar converter 1 in FIG. 1, so the details will not be repeated.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A planar converter, comprising:
   a magnetic unit comprising at least two first planar windings, at least one second planar winding and a magnetic core assembly, the at least two first planar windings and the at least one second planar winding magnetically coupled through the magnetic core assembly;
   at least two closed circuits, wherein each closed circuit comprises at least one of the first planar windings, at least one first switch, and has at least two connection points comprising a first connection point and a second connection point;
   two printed circuit boards (PCBs), wherein each printed circuit board comprises a first surface and a second surface opposite to each other, and each printed circuit board is provided with at least one of the closed circuits thereon, wherein the second surfaces of the two printed circuit boards are adjacent; and
   at least two first connectors each comprising two welding ends opposite to each other,
   wherein the two welding ends of one of the at least two first connectors are connected to the first connection points of the two closed circuits on the two PCBs, respectively, and the two welding ends of another one of the at least two first connectors are connected to the second connection points of the two closed circuits on the two PCBs, respectively, and the two closed circuits are electrically connected in parallel through the at least two first connectors.

2. The planar converter of claim 1, wherein a number of turns of the first planar windings of the magnetic unit is less than a number of turns of the second planar windings.

3. The planar converter of claim 1, wherein at least one of the two PCBs is provided with at least one second planar winding thereon, and the at least one second planar winding is non-coplanar with the at least two first planar windings.

4. The planar converter of claim 3, wherein the first surface of each of the PCBs is provided with at least one of the closed circuits thereon, and the second surface of at least one of the two PCBs is provided with at least one second planar winding thereon.

5. The planar converter of claim 4, wherein the magnetic unit comprises at least two second planar windings, the first surface of each of the PCBs is provided with at least one of the closed circuits thereon, and the second surface of each of the PCBs is provided with at least one of the second planar windings thereon.

6. The planar converter of claim 3, wherein the first surface of each of the PCBs is provided with at least one of the second planar windings thereon, and the second surface of each of the PCBs is provided with at least one of the closed circuits thereon.

7. The planar converter of claim 4, further comprising at least one second connector, each comprising two welding ends opposite to each other,
   one of the welding ends of each second connector is disposed on the second planar windings on the second surface of one of the two PCBs, or one of the welding ends of each second connector is disposed on a projective region that the first planar windings of one of the two PCBs are projected onto the corresponding second surface;
   another one of the welding ends of each second connector is disposed on the second planar windings on the second surface of another one of the two PCBs, or another one of the welding ends of each second connector is disposed on a projective region that the first planar windings of another one of the two PCBs are projected onto the corresponding second surface.

8. The planar converter of claim 6, further comprising at least one second connector, each comprising two welding ends opposite to each other,
   one of the welding ends of each second connector is disposed on the first planar windings on the second surface of one of the two PCBs, or one of the welding ends of each second connector is disposed on a projective region that the second planar windings of one of the two PCBs are projected onto the corresponding second surface;
   another one of the welding ends of each second connector is disposed on the first planar windings on the second surface of another one of the two PCBs, or another one of the welding ends of each second connector is disposed on a projective region that the second planar windings of another one of the two PCBs are projected onto the corresponding second surface.

9. The planar converter of claim 1, further comprising at least one second connector, each comprising two welding ends opposite to each other, wherein the first connectors and the second connectors are made from an electrical conductive material with good heat conductive property, respectively.

10. The planar converter of claim 9, wherein the first connectors and the second connectors are copper block or copper bulk or a connection column, respectively, the two welding ends of one of the at least two first connectors are connected to the second surfaces of the two PCBs, respectively, and the first connection points of the two closed circuits on the two PCBs are electrically connected; and the two welding ends of another one of the at least two first connectors are connected to the second surfaces of the two PCBs, respectively, and the second connection points of the two closed circuits on the two PCBs are electrically connected.

11. The planar converter of claim 1, further comprising at least one heat dissipation assembly, each heat dissipation assembly is connected to the second surface of one of the two PCBs, and adjacent to at least one heat generating assembly on the second surface to dissipate heat from the heat generating assembly.

12. The planar converter of claim 1, further comprising two or more guide pins penetrating the two PCBs and protruding from the first surface of one of the two PCBs, respectively, and one of the two guide pins constitutes an input terminal of the planar converter, and another one of the two guide pins constitutes an output terminal of the planar converter.

13. The planar converter of claim 1, wherein the magnetic unit further comprises a magnetic core assembly comprising two magnetic cores, one of the two magnetic cores is disposed on the first surface of one of the two PCBs and penetrates through the one of the two PCBs, and another one of the two magnetic cores is disposed on the first surface of another one of the two PCBs and penetrates through the another one of the two PCBs.

14. The planar converter of claim 1, wherein each of the first switches is adjacent to one end of the corresponding first planar winding.

15. The planar converter of claim 1, wherein each of the first connection points and each of the second connection points are a DC potential point, respectively.

* * * * *